(12) United States Patent
Yoshimura et al.

(10) Patent No.: US 11,363,186 B2
(45) Date of Patent: Jun. 14, 2022

(54) IMAGE PICKUP DEVICE AND ELECTRONIC APPARATUS WITH AN IMAGE PLANE PHASE DIFFERENCE DETECTION PIXEL

(71) Applicant: SONY SEMICONDUCTOR SOLUTIONS CORPORATION, Kanagawa (JP)

(72) Inventors: Kyohei Yoshimura, Kanagawa (JP); Toshifumi Wakano, Kanagawa (JP); Yusuke Otake, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 17/025,975

(22) Filed: Sep. 18, 2020

(65) Prior Publication Data

US 2021/0006726 A1    Jan. 7, 2021

Related U.S. Application Data

(63) Continuation of application No. 16/540,827, filed on Aug. 14, 2019, now Pat. No. 10,827,112, which is a (Continued)

(30) Foreign Application Priority Data

Feb. 9, 2015 (JP) .................................. 2015-023416

(51) Int. Cl.
*H01L 29/08* (2006.01)
*H04N 5/232* (2006.01)
(Continued)

(52) U.S. Cl.
CPC ......... *H04N 5/232122* (2018.08); *G02B 7/34* (2013.01); *G02B 7/365* (2013.01);
(Continued)

(58) Field of Classification Search
CPC ................... H04N 5/232122; H01L 27/14621
See application file for complete search history.

(56) References Cited

U.S. PATENT DOCUMENTS

2008/0230123 A1* 9/2008 Mitsui ................... H01L 51/447
136/263
2008/0308149 A1* 12/2008 Nomura ............... C07D 209/60
136/256
(Continued)

FOREIGN PATENT DOCUMENTS

JP          2006269923 A       10/2006
JP          2007065330 A       3/2007
(Continued)

*Primary Examiner* — Caleb E Henry
(74) *Attorney, Agent, or Firm* — Sheridan Ross P.C.

(57) ABSTRACT

The present disclosure relates to an image pickup device that enables inhibition of occurrence of color mixture or noise, and an electronic apparatus. The image pickup device of the present disclosure includes an image plane phase difference detection pixel for obtaining a phase difference signal for image plane phase difference AF. The image plane phase difference detection pixel includes: a first photoelectric conversion section that generates an electric charge in response to incident light; an upper electrode section that is one of electrodes disposed facing each other across the first photoelectric conversion section, the upper electrode section being formed on an incident side of the incident light on the first photoelectric conversion section; and a lower electrode section that is another of the electrodes disposed facing each other across the first photoelectric conversion section, the lower electrode section being formed on an opposite side of the incident side of the incident light on the first photoelectric conversion section, the lower electrode section being multiple-divided at a position that avoids a center of the incident light. The present disclosure is applicable to image sensors.

18 Claims, 8 Drawing Sheets

Related U.S. Application Data continuation of application No. 15/547,571, filed as application No. PCT/JP2016/052582 on Jan. 29, 2016, now Pat. No. 10,432,844.

(51) Int. Cl.

| | | |
|---|---|---|
| *G02B 7/34* | (2021.01) | |
| *H01L 27/14* | (2006.01) | |
| *H01L 27/146* | (2006.01) | |
| *H04N 5/369* | (2011.01) | |
| *G02B 7/36* | (2021.01) | |
| *H01L 27/30* | (2006.01) | |
| *H04N 5/357* | (2011.01) | |

(52) U.S. Cl.
CPC ............ *H01L 27/14* (2013.01); *H01L 27/146* (2013.01); *H01L 27/14621* (2013.01); *H01L 27/307* (2013.01); *H04N 5/36961* (2018.08); *H04N 5/357* (2013.01); *H04N 2209/045* (2013.01)

(56) References Cited

U.S. PATENT DOCUMENTS

| | | | | |
|---|---|---|---|---|
| 2009/0026379 A1* | 1/2009 | Yaegashi | ............... | G01T 1/2018 250/370.09 |
| 2009/0218650 A1* | 9/2009 | Lee | .................. | H01L 27/14627 257/458 |
| 2010/0060756 A1* | 3/2010 | Inuiya | ............... | H01L 27/14685 348/280 |
| 2010/0060769 A1* | 3/2010 | Inuiya | ............... | H01L 27/14625 348/311 |
| 2011/0310282 A1* | 12/2011 | Toda | ................. | H01L 27/14632 348/308 |
| 2012/0025061 A1* | 2/2012 | Izuha | .................. | H04N 5/3698 250/208.1 |
| 2012/0310451 A1* | 12/2012 | Kerhuel | .................. | G01S 3/782 356/28 |
| 2013/0015435 A1* | 1/2013 | Sawaki | ............... | H01L 51/4253 257/40 |
| 2014/0117486 A1* | 5/2014 | Doi | .................... | H01L 27/14621 257/448 |
| 2014/0231782 A1* | 8/2014 | Imai | ...................... | H01L 27/307 257/40 |
| 2015/0077606 A1* | 3/2015 | Ohtsuki | ............... | H01L 27/1464 348/300 |
| 2017/0142338 A1* | 5/2017 | Tanaka | .................... | G06T 5/003 |
| 2019/0174085 A1* | 6/2019 | Koizumi | ............ | H04N 5/37457 |

FOREIGN PATENT DOCUMENTS

| | | |
|---|---|---|
| JP | 2008028105 A | 2/2008 |
| JP | 2009049525 A | 3/2009 |
| JP | 2011103335 A | 5/2011 |
| JP | 2011176714 A | 9/2011 |
| JP | 2012004443 A | 1/2012 |
| JP | 2012242530 A | 12/2012 |
| JP | 2013118335 A | 6/2013 |
| JP | 2013145292 A | 7/2013 |
| JP | 2013187475 A | 9/2013 |
| JP | 2014022415 A | 2/2014 |
| WO | WO-2014208047 A1 | 12/2014 |

\* cited by examiner

IMAGE PICKUP DEVICE AND ELECTRONIC APPARATUS WITH AN IMAGE PLANE PHASE DIFFERENCE DETECTION PIXEL

CROSS REFERENCE TO RELATED APPLICATIONS

This application is a continuation of U.S. patent application Ser. No. 16/540,827, filed Aug. 14, 2019, which is a continuation of U.S. patent application Ser. No. 15/547,571, filed Jul. 31, 2017, now U.S. Pat. No. 10,432,844, which is a national stage application under 35 U.S.C. 371 and claims the benefit of PCT Application No. PCT/JP2016/052582 having an international filing date of Jan. 29, 2016, which designated the United States, which PCT application claimed the benefit of Japanese Patent Application No. 2015-023416 filed Feb. 9, 2015, the disclosures of which are incorporated herein by reference in their entirety.

TECHNICAL FIELD

The present disclosure relates to image pickup devices and electronic apparatuses, and more particularly to an image pickup device including a normal pixel for obtaining an image signal and an image plane phase difference detection pixel for obtaining a phase difference signal for image plane phase difference automatic focusing (AF), and electronic apparatuses.

BACKGROUND ART

Conventionally, there has been proposed an image pickup device including a normal pixel and an image plane phase difference detection pixel, in which an organic photoelectric conversion film is provided in addition to a photodiode (PD) as photoelectric conversion sections of the image pickup device (for example, see Patent Document 1).

The image pickup device has a configuration in which, as major constituent elements, an on-chip lens, a transparent upper electrode, an organic photoelectric conversion film, a transparent lower electrode, and a PD are formed in order from a light-incident side. In particular, the lower electrode of the organic photoelectric conversion film of the image plane phase difference detection pixel is provided with a slit at an optical center of the on-chip lens where intensity of incident light is highest.

CITATION LIST

Patent Document

Patent Document 1: Japanese Patent Application Laid-Open No. 2013-145292

SUMMARY OF THE INVENTION

Problems to be Solved by the Invention

Since the lower electrode of the organic photoelectric conversion film is provided with a slit as described above in the image pickup device described in Patent Document 1, a lot of light passes through the slit of the lower electrode without being photoelectrically converted by the organic photoelectric conversion film and is photoelectrically converted by the PD into color mixture.

In addition, even in a case where a configuration in which the PD is omitted from the image pickup device is assumed, the incident light leaks from the slit to the lower layer side, which can generate noise.

The present disclosure has been made in view of such circumstances, and is intended to keep generation of noise resulting from leakage of incident light within a pixel under control.

Solutions to Problems

An image pickup device that is a first aspect of the present disclosure includes an image plane phase difference detection pixel for obtaining a phase difference signal for image plane phase difference AF, and the image plane phase difference detection pixel includes: a first photoelectric conversion section that generates an electric charge in response to incident light; an upper electrode section that is one of electrodes disposed facing each other across the first photoelectric conversion section, the upper electrode section being formed on an incident side of the incident light on the first photoelectric conversion section; and a lower electrode section that is another of the electrodes disposed facing each other across the first photoelectric conversion section, the lower electrode section being formed on an opposite side of the incident side of the incident light on the first photoelectric conversion section, the lower electrode section being multiple-divided at a position that avoids a center of the incident light.

The lower electrode section can include a first lower electrode section and a second lower electrode section that are unevenly two-divided at the position that avoids the center of the incident light.

The upper electrode section can include a member that transmits light, and the lower electrode section can include a member that reflects light.

An output of one of the first and the second lower electrode sections can be used as the phase difference signal for image plane phase difference AF.

Outputs of the first and the second lower electrode sections can be added to be used as an image signal.

The image pickup device that is the first aspect of the present disclosure can further include a normal pixel for obtaining an image signal.

The image plane phase difference detection pixel can further include a light concentrating section that concentrates the incident light on the first photoelectric conversion section, and the lower electrode section can be unevenly two-divided at a position that avoids an optical center of the light concentrating section.

The image plane phase difference detection pixel can further include a color filter that is colored on a pixel-by-pixel basis, the color filter causing only a specified wavelength component of the incident light to pass through the color filter and to enter the first photoelectric conversion section.

The first photoelectric conversion section can generate an electric charge in response to only a specified wavelength component of the incident light.

The lower electrode section can include a member that transmits the incident light, and the image plane phase difference detection pixel can further include a second photoelectric conversion section that generates an electric charge in response to light that passes through the first photoelectric conversion section and the lower electrode section.

At least one of the first and the second photoelectric conversion sections can be an organic photoelectric conversion film.

An electronic apparatus that is a second aspect of the present disclosure is equipped with an image pickup device including an image plane phase difference detection pixel for obtaining a phase difference signal for image plane phase difference AF, and the image plane phase difference detection pixel includes: a first photoelectric conversion section that generates an electric charge in response to incident light; an upper electrode section that is one of electrodes disposed facing each other across the first photoelectric conversion section, the upper electrode section being formed on an incident side of the incident light on the first photoelectric conversion section; and a lower electrode section that is another of the electrodes disposed facing each other across the first photoelectric conversion section, the lower electrode section being formed on an opposite side of the incident side of the incident light on the first photoelectric conversion section, the lower electrode section being multiple-divided at a position that avoids a center of the incident light.

An image pickup device that is a third aspect of the present disclosure includes an image plane phase difference detection pixel for obtaining a phase difference signal for image plane phase difference AF, and the image plane phase difference detection pixel includes: a first photoelectric conversion section that generates an electric charge to be used as an image signal in response to incident light; an upper electrode section that is one of electrodes disposed facing each other across the first photoelectric conversion section, the upper electrode section being formed on an incident side of the incident light on the first photoelectric conversion section; a lower electrode section that is another of the electrodes disposed facing each other across the first photoelectric conversion section, the lower electrode section being formed on an opposite side of the incident side of the incident light on the first photoelectric conversion section; a second photoelectric conversion section that generates an electric charge to be used as the phase detection signal in response to light that passes through the first photoelectric conversion section and the lower electrode section; and a light-shielding section formed between the lower electrode section and the second photoelectric conversion section to cover a center of the light that passes through the first photoelectric conversion section and the lower electrode section.

The light-shielding section can include a member that reflects light.

An electronic apparatus that is a fourth aspect of the present disclosure is equipped with an image pickup device including an image plane phase difference detection pixel for obtaining a phase difference signal for image plane phase difference AF, and the image plane phase difference detection pixel includes: a first photoelectric conversion section that generates an electric charge to be used as an image signal in response to incident light; an upper electrode section that is one of electrodes disposed facing each other across the first photoelectric conversion section, the upper electrode section being formed on an incident side of the incident light on the first photoelectric conversion section; a lower electrode section that is another of the electrodes disposed facing each other across the first photoelectric conversion section, the lower electrode section being formed on an opposite side of the incident side of the incident light on the first photoelectric conversion section; a second photoelectric conversion section that generates an electric charge to be used as the phase detection signal in response to light that passes through the first photoelectric conversion section and the lower electrode section; and a light-shielding section formed between the lower electrode section and the second photoelectric conversion section to cover a center of the light that passes through the first photoelectric conversion section and the lower electrode section.

Effects of the Invention

According to the first to fourth aspects of the present disclosure, occurrence of color mixture or noise can be inhibited.

MODE FOR CARRYING OUT THE INVENTION

The best form for carrying out the present disclosure (hereinafter referred to as embodiment) will be described in detail below with reference to the drawings.

<First Configuration Example of Image Pickup Device to Which the Present Disclosure is Applied>

Figure 1:
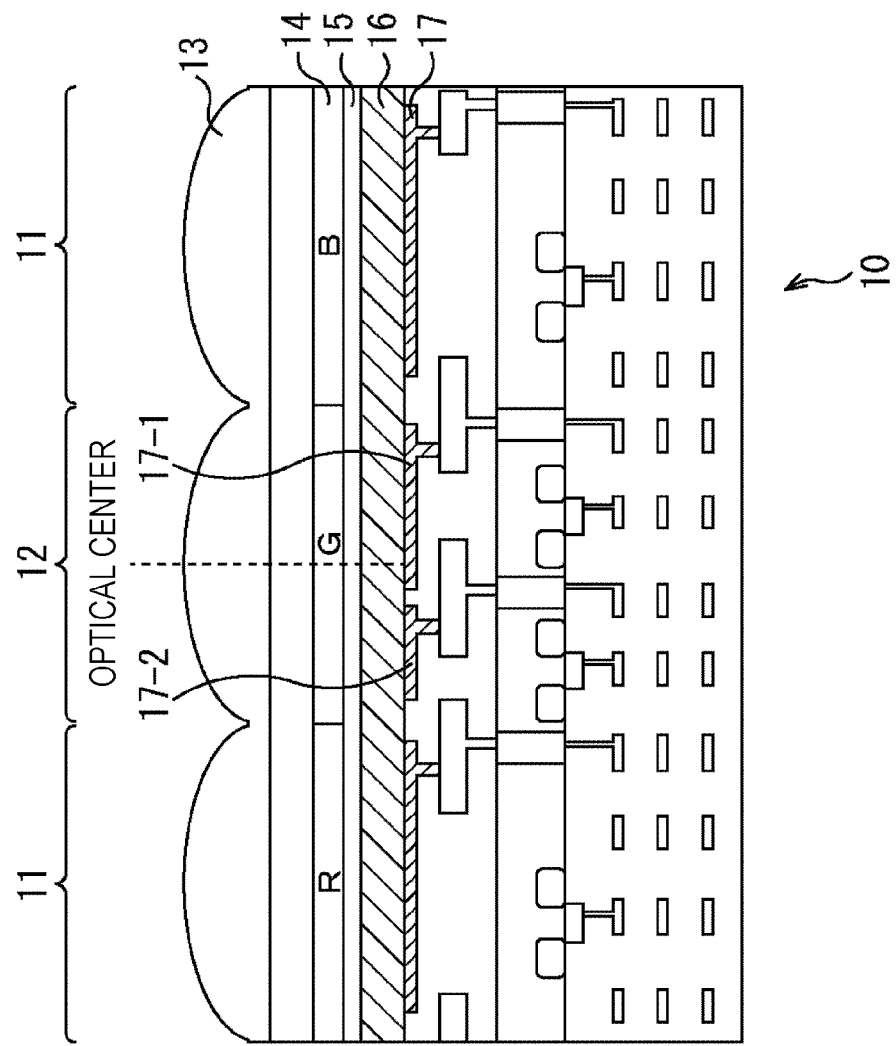
FIG. 1 is a cross-sectional view illustrating a first configuration example of an image pickup device to which the present disclosure is applied.

FIG. 1 is a cross-sectional view illustrating a first configuration example of an image pickup device to which the present disclosure is applied.

The image pickup device 10 includes normal pixels 11 and image plane phase difference detection pixels 12, and has a configuration in which, as major constituent elements, an on-chip lens (OCL) 13, a color filter (CF) 14, an upper electrode 15, an organic photoelectric conversion film 16, and a lower electrode 17 are formed in order from a light-incident side. Furthermore, on a lower layer side of the lower electrode 17, various pixel transistors, floating diffusion (FD), and the like are formed (reference numerals are omitted).

The on-chip lens 13 is formed in each pixel, and concentrates incident light onto the organic photoelectric conversion film 16. Note that as a light concentrating section that concentrates incident light, a constituent element other than the on-chip lens 13 may be used. The color filter 14 has a color of red (R) or blue (B) in the normal pixel 11. Meanwhile, the color filter 14 has a color of green (G) in the image plane phase difference detection pixel 12. For example, a Bayer array is applicable to arrangement of R, G, and B. In addition, for example, a ClearVid array may be applied to arrangement of R, G, and B. In that case, since the image plane phase difference detection pixels 12 with the color G of the color filter 14 are adjacent to each other, a phase difference signal with a short distance between the image plane phase difference detection pixels 12 can be obtained. However, the color of the color filter 14 of the image plane phase difference detection pixel 12 is not limited to G, and may be R or B.

The upper electrode 15 is formed of a transparent material that transmits the incident light concentrated by the on-chip lens 13. The organic photoelectric conversion film 16 responds to light of wavelengths of R, G, and B, and generates an electric charge according to light quantity of the incident light.

The lower electrode 17 is made of a metal material or the like that reflects light. The lower electrode 17 reflects light that passes through the organic photoelectric conversion film 16 and thereby makes an optical path of the incident light longer, which can enhance efficiency of photoelectric conversion in the organic photoelectric conversion film 16. In addition, this can decrease thickness of the organic photoelectric conversion film 16.

Note that in each normal pixel 11, the lower electrode 17 is formed without division of an area of one pixel. On the other hand, in the image plane phase difference detection pixel 12, an area of one pixel is unevenly divided by a slit that is so provided as to avoid an optical center of the on-chip lens 13. Accordingly, the lower electrode 17 is formed at a position where intensity of the incident light is highest, which can inhibit the incident light from leaking to layers lower than the lower electrode 17. Therefore, this can inhibit occurrence of noise or color mixture.

In this diagram, the lower electrode 17 of the image plane phase difference detection pixel 12 includes a longer lower electrode 17-1 and a shorter lower electrode 17-2. However, the number of divisions of the lower electrode 17 of the image plane phase difference detection pixel 12 is not limited to two.

The longer lower electrode 17-1 can obtain a pixel output with higher sensitivity than the shorter lower electrode 17-2. On the other hand, the shorter lower electrode 17-2 can obtain a pixel output with a better separation ratio than the longer lower electrode 17-1. Therefore, using the pixel output of one of the lower electrodes 17-1 and 17-2 allows implementation of high-precision image plane phase difference AF.

In both of the normal pixel 11 and the image plane phase difference detection pixel 12 of the image pickup device 10, the incident light concentrated by the on-chip lens 13 enters the organic photoelectric conversion film 16 through the color filter 14 and the upper electrode 15, and is then converted into an electric charge. The converted electric charge is output to a downstream stage (FD or the like) through the lower electrode 17.

In the downstream stage, the output from the normal pixel 11 is used as an image signal. From the image plane phase difference detection pixel 12, a plurality of outputs is obtained from the lower electrodes 17-1 and 17-2, and one of these outputs is used as a phase difference signal for image plane phase difference AF. Adding the plurality of outputs from the image plane phase difference detection pixel 12 provides an output equivalent to the output from the normal pixel 11.

Note that the on-chip lens 13 may be omitted from constituent elements of the image pickup device 10 illustrated in FIG. 1. In that case, an effect of inhibiting occurrence of noise or color mixture cannot be expected, but a pixel output with high sensitivity and a pixel output with a good separation ratio can be obtained. Using one of the pixel outputs allows implementation of high-precision image plane phase difference AF.

<Second Configuration Example of Image Pickup Device to Which the Present Disclosure is Applied>

Figure 2:
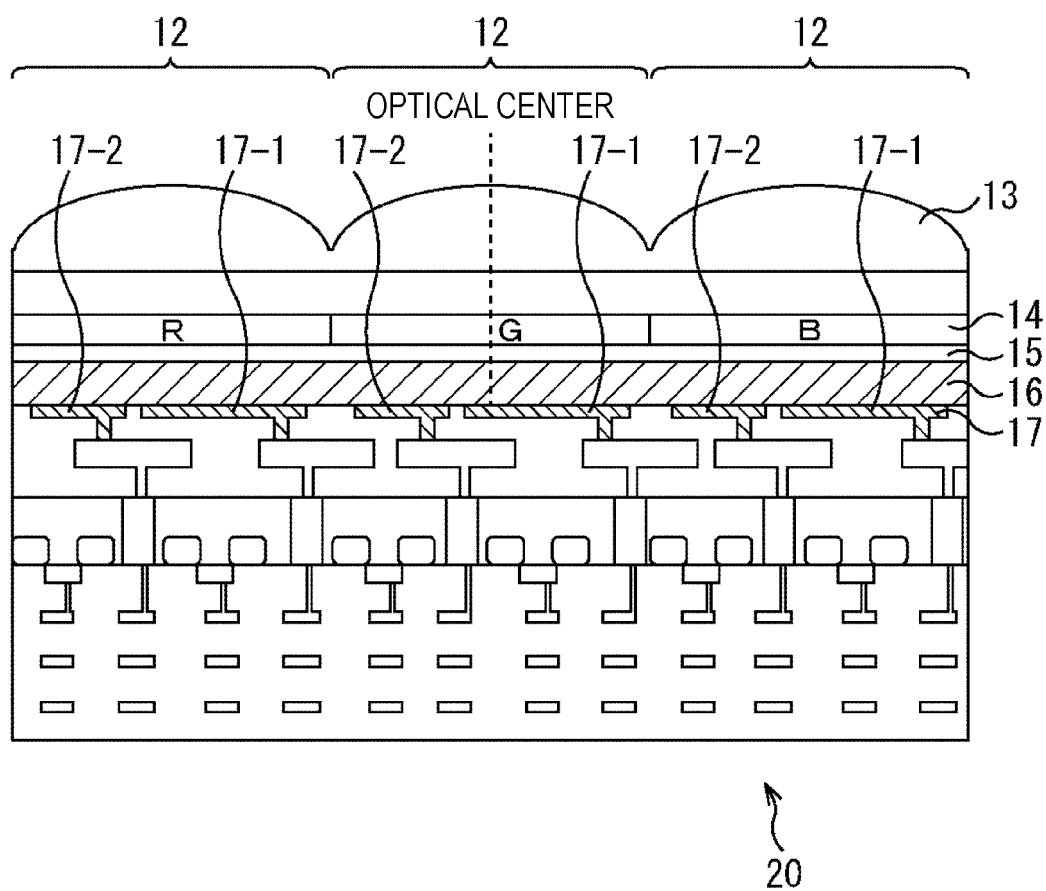
FIG. 2 is a cross-sectional view illustrating a second configuration example of the image pickup device to which the present disclosure is applied.

FIG. 2 is a cross-sectional view illustrating a second configuration example of the image pickup device to which the present disclosure is applied.

The image pickup device 20 is not provided with normal pixels. The structure of the image plane phase difference detection pixel 12 in the image pickup device 10 illustrated in FIG. 1 is employed in all the pixels (except for color of color filters). Note that, of constituent elements of the image pickup device 20, the already mentioned constituent elements common to the image pickup device 10 are denoted with the same reference numerals, and thus descriptions thereof will be omitted as appropriate. This similarly applies to the configuration examples described below.

That is, in the image pickup device 20, all the pixels are the image plane phase difference detection pixels 12, and either one of R, G and B is employed as color of the color filter 14. Note that, for example, a Bayer array is applicable to arrangement of R, G, and B. In addition, the lower electrode 17 is multiple-divided in every pixel of the image pickup device 20.

In every pixel of the image pickup device 20, incident light concentrated by the on-chip lens 13 enters the organic photoelectric conversion film 16 through the color filter 14 and the upper electrode 15, and is then converted into an electric charge. The converted electric charge is output to a downstream stage (FD or the like) through the lower electrode 17.

In the downstream stage, an image signal can be obtained by adding a plurality of outputs in each pixel (outputs of the lower electrodes 17-1 and 17-2). In addition, an arbitrary pixel out of all the pixels can be selected and the plurality of outputs of the pixel can be used as phase difference signals for image plane phase difference AF.

Note that the on-chip lens 13 may be omitted from constituent elements of the image pickup device 20 illustrated in FIG. 2. In that case, an effect of inhibiting occurrence of noise or color mixture cannot be expected, but a pixel output with high sensitivity and a pixel output with a good separation ratio can be obtained. Using one of the pixel outputs allows implementation of high-precision image plane phase difference AF.

<Third Configuration Example of Image Pickup Device to Which the Present Disclosure is Applied>

Figure 3:
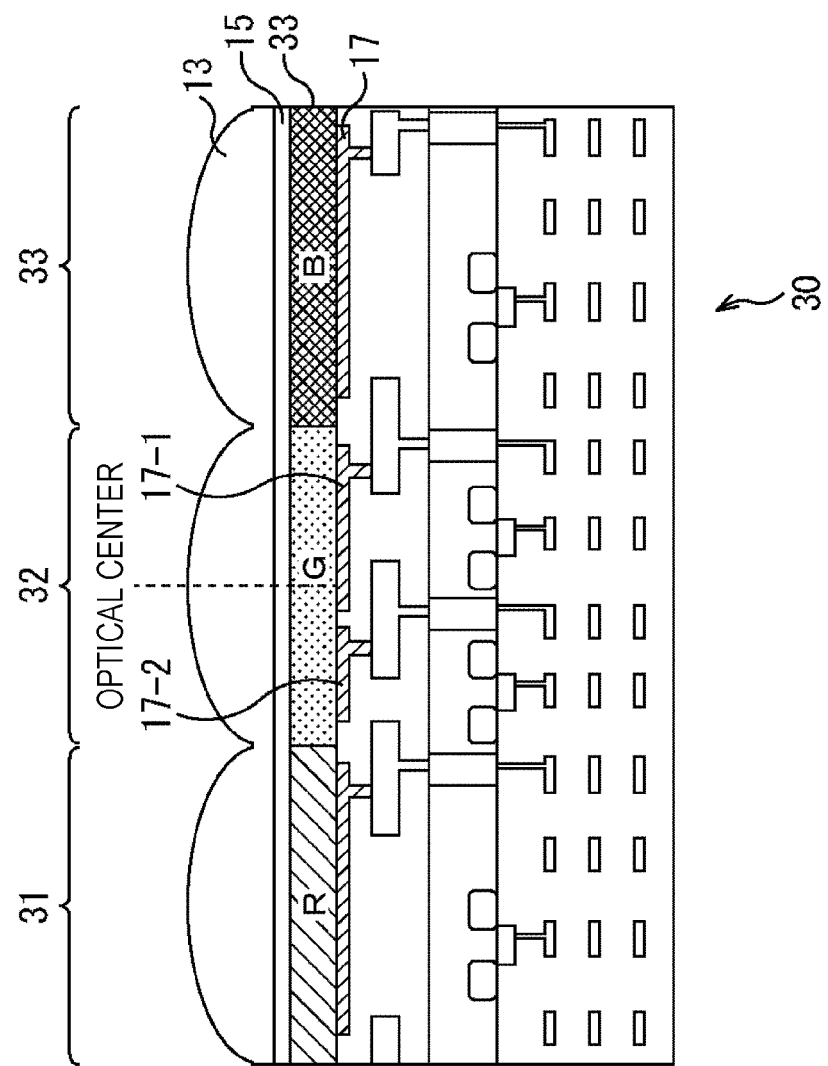
FIG. 3 is a cross-sectional view illustrating a third configuration example of the image pickup device to which the present disclosure is applied.

FIG. 3 is a cross-sectional view illustrating a third configuration example of the image pickup device to which the present disclosure is applied.

The image pickup device 30 includes normal pixels 31 and image plane phase difference detection pixels 32, and has a configuration in which, as major constituent elements, the on-chip lens 13, the upper electrode 15, a specified wavelength limited organic photoelectric conversion film 33, and the lower electrode 17 are formed in order from a light-incident side. Furthermore, on a lower layer side of the lower electrode 17, various pixel transistors, FD, and the like are formed (reference numerals are omitted).

The specified wavelength limited organic photoelectric conversion film 33 responds only to light of a wavelength of either one of R, G, and B, and generates an electric charge according to quantity of the light. That is, the specified wavelength limited organic photoelectric conversion film 33 of the left-end normal pixel 31 in the diagram responds only to light of a wavelength of R. The specified wavelength limited organic photoelectric conversion film 33 of the central image plane phase difference detection pixel 32 in the diagram responds only to light of a wavelength of G. The specified wavelength limited organic photoelectric conversion film 33 of the right-end normal pixel 31 in the diagram responds only to light of a wavelength of R.

In both of the normal pixel 31 and the image plane phase difference detection pixel 32 of the image pickup device 30, incident light concentrated by the on-chip lens 13 enters the specified wavelength limited organic photoelectric conversion film 16 through the upper electrode 15, and is then converted into an electric charge. The converted electric charge is output to a downstream stage (FD or the like) through the lower electrode 17.

In the downstream stage, the pixel output from the normal pixel 31 is used as an image signal. From the image plane phase difference detection pixel 32, a plurality of outputs is obtained from the lower electrodes 17-1 and 17-2, and one of these outputs is used as a phase difference signal for image plane phase difference AF. Adding the plurality of outputs from the image plane phase difference detection pixel 32 provides a pixel output equivalent to the pixel output from the normal pixel 31.

Note that the on-chip lens 13 may be omitted from constituent elements of the image pickup device 30 illustrated in FIG. 3. In that case, an effect of inhibiting occurrence of noise or color mixture cannot be expected, but a pixel output with high sensitivity and a pixel output with a good separation ratio can be obtained. Using one of the pixel outputs allows implementation of high-precision image plane phase difference AF.

<Fourth Configuration Example of Image Pickup Device to Which the Present Disclosure is Applied>

Figure 4:
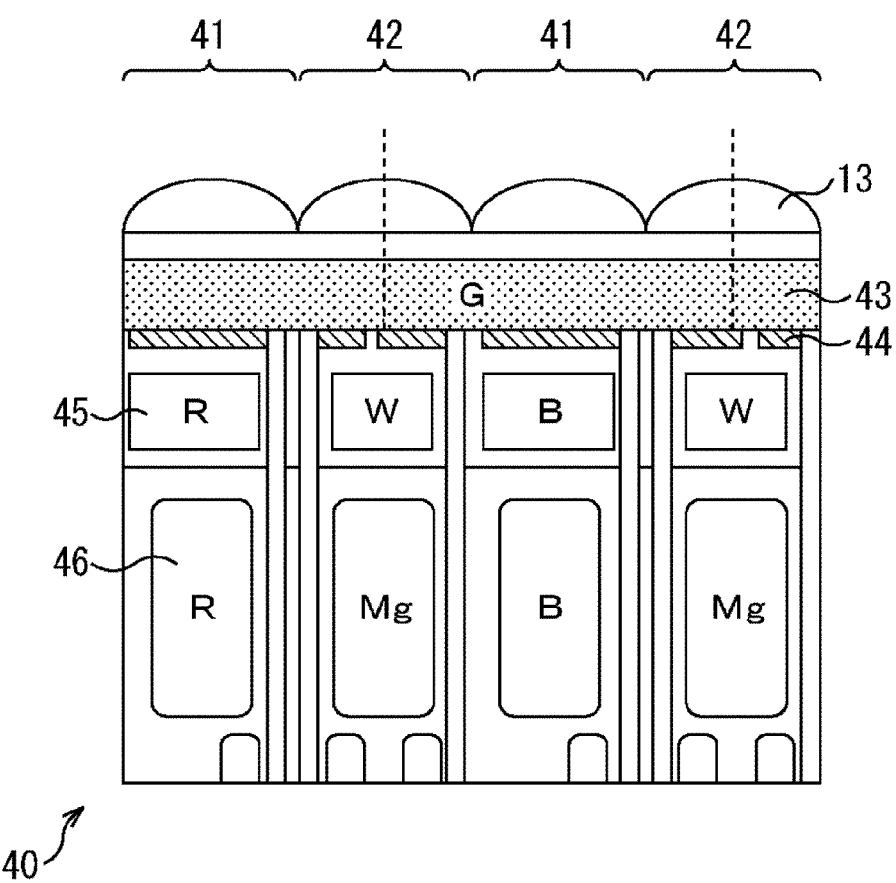
FIG. 4 is a cross-sectional view illustrating a fourth configuration example of the image pickup device to which the present disclosure is applied.

FIG. 4 is a cross-sectional view illustrating a fourth configuration example of the image pickup device to which the present disclosure is applied.

The image pickup device 40 includes normal pixels 41 and image plane phase difference detection pixels 42. Two photoelectric conversion sections (a specified wavelength limited organic photoelectric conversion film 43 and a PD 46) are formed in each pixel. The image pickup device 40 has a configuration in which, as major constituent elements, the on-chip lens 13, the upper electrode 15, the specified wavelength limited organic photoelectric conversion film 43, a lower electrode 44, a color filter (CF) 45, and the PD 46 are formed in order from a light-incident side.

The specified wavelength limited organic photoelectric conversion film 43 responds only to light of a wavelength of G, and generates an electric charge according to quantity of the light.

The lower electrode 44 is formed of a transparent member that transmits light, and outputs the electric charge converted by the specified wavelength limited organic photoelectric conversion film 43 to a downstream stage. In addition, in the normal pixel 41, the lower electrode 44 is formed without division of an area of one pixel, in a similar manner to the lower electrode 17 or the like of the image pickup device 10 or the like.

On the other hand, in the image plane phase difference detection pixel 42, an area of one pixel of the lower electrode 44 is unevenly divided by a slit that is so provided as to avoid the optical center of the on-chip lens 13. Accordingly, in the image plane phase difference detection pixels 42, the longer lower electrode 44-1 can obtain a pixel output with higher sensitivity than the shorter lower electrode 44-2. On the other hand, the shorter lower electrode 44-2 can obtain a pixel output with a better separation ratio than the longer lower electrode 44-1. Therefore, using the pixel output of one of the lower electrodes 44-1 and 44-2 allows implementation of high-precision image plane phase difference AF.

The color filter 45 has color of R or B in the normal pixel 41, and color of white (W) in the image plane phase difference detection pixel 42. Note that color arrangement of the color filter 45 is not limited to the above-described example.

In the first and third normal pixels 41 from the left end in the diagram, the PD 46 generates an electric charge in response to light of R or B that has passed through the specified wavelength limited organic photoelectric conversion film 43 and the color filter 44 of R or B. In the second and fourth image plane phase difference detection pixels 42 from the left end in the diagram, the PD 46 generates an electric charge in response to light of magenta (Mg) that has passed through the specified wavelength limited organic photoelectric conversion film 43 and the color filter 44 of W. Note that a photoelectric conversion film may be disposed instead of the PD 46.

In both the normal pixels 41 and the image plane phase difference detection pixels 42 of the image pickup device 40, incident light concentrated by the on-chip lens 13 enters the specified wavelength limited organic photoelectric conversion film 43 through the upper electrode 15, and a G component of the incident light is converted into an electric charge. Furthermore, light other than the G component that has passed through the specified wavelength limited organic photoelectric conversion film 43 enters the PD 46 through the lower electrode 44 and the color filter 45, and is converted into an electric charge.

The electric charge generated by the specified wavelength limited organic photoelectric conversion film 43 of the normal pixels 41 is output to a downstream stage through the lower electrode 44, and is used as a G component of an image signal. In addition, the electric charge generated by the PD 46 of the normal pixel 41 is output to a downstream stage through an electrode (not illustrated), and is used as an R or B component of an image signal.

Meanwhile, the electric charge generated by the specified wavelength limited organic photoelectric conversion film 43 of the image plane phase difference detection pixels 42 is output to a downstream stage from the lower electrodes 44-1 and 44-2, and the output from one of the lower electrodes 44-1 and 44-2 is used as a phase difference signal for image plane phase difference AF. Note that addition of the outputs from the lower electrodes 44-1 and 44-2 can be used as a pixel signal of the G component equivalent to the normal pixel 41. In addition, the electric charge generated by the PD 46 of the image plane phase difference detection pixels 42 is output to a downstream stage through an electrode (not illustrated), and is used as an Mg component of an image signal.

Note that the on-chip lens 13 may be omitted from constituent elements of the image pickup device 40 illustrated in FIG. 4. In that case, an effect of inhibiting occurrence of noise or color mixture cannot be expected, but a pixel output with high sensitivity and a pixel output with a good separation ratio can be obtained. Using one of the pixel outputs allows implementation of high-precision image plane phase difference AF.

<Fifth Configuration Example of Image Pickup Device to Which the Present Disclosure is Applied>

Figure 5:
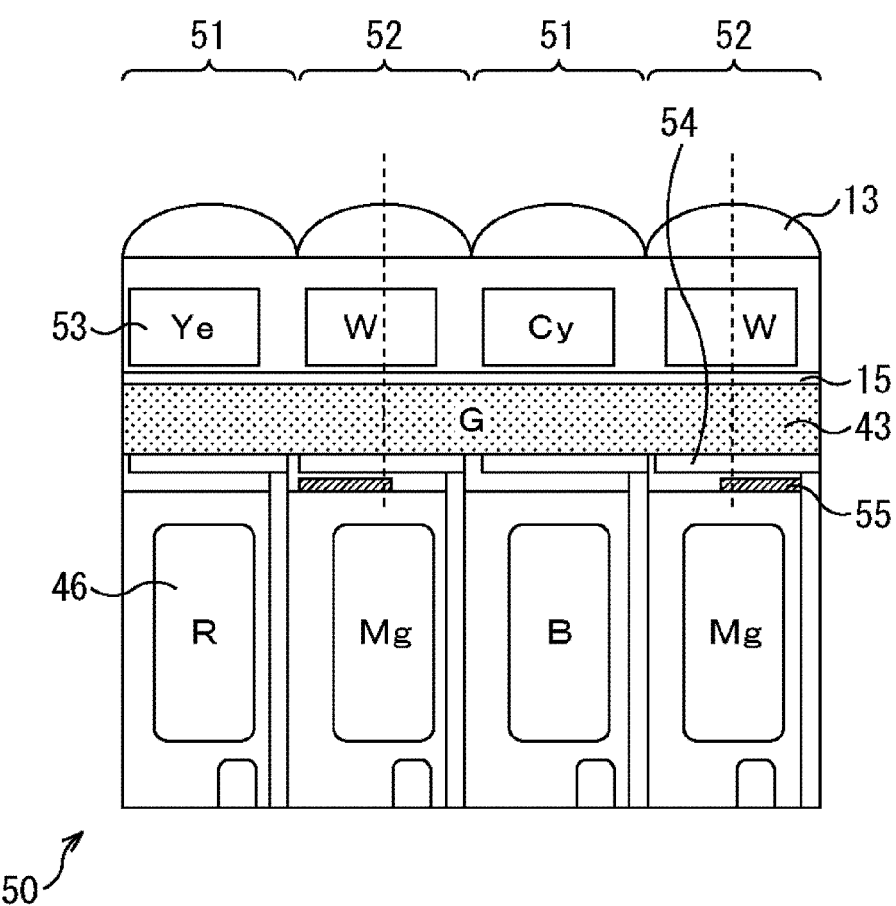
FIG. 5 is a cross-sectional view illustrating a fifth configuration example of the image pickup device to which the present disclosure is applied.

FIG. 5 is a cross-sectional view illustrating a fifth configuration example of the image pickup device to which the present disclosure is applied.

The image pickup device 50 includes normal pixels 51 and image plane phase difference detection pixels 52. Two photoelectric conversion sections (the specified wavelength limited organic photoelectric conversion film 43 and the PD 46) are formed in each pixel. The image pickup device 50 has a configuration in which, as major constituent elements, the on-chip lens 13, a color filter 53, the upper electrode 15, the specified wavelength limited organic photoelectric conversion film 43, a lower electrode 54, and the PD 46 are formed in order from a light-incident side. Furthermore, in the image plane phase difference detection pixel 52, a light-shielding film 55 is formed between the lower electrode 54 and the PD 46.

The color filter 53 has color of yellow (Ye) or cyan (Cy) in the normal pixel 51, and color of white (W) in the image plane phase difference detection pixel 52. Note that color arrangement of the color filter 45 is not limited to the above-described example.

The specified wavelength limited organic photoelectric conversion film 43 responds only to light of a wavelength of G, and generates an electric charge according to quantity of the light.

The lower electrode 54 is formed of a transparent member that transmits light. The lower electrode 54 is formed without division of an area of one pixel in both the normal pixels 51 and the image plane phase difference detection pixels 52.

The light-shielding film 55 provided only in the image plane phase difference detection pixel 52 is made of a member that reflects light, such as metal, and is formed to cover the optical center of the on-chip lens 13. Note that adjustment of a horizontal length of the light-shielding film 55 allows adjustment of sensitivity of the specified wavelength limited organic photoelectric conversion film 43 to light of a wavelength of G, and adjustment of light quantity entering the PD 46 that generates an electric charge serving as a basis for a phase difference signal.

In the first and third normal pixels 51 from the left end in the diagram, the PD 46 generates an electric charge in response to light of R or B that has passed through the color filter 53 of Ye or Cy and the specified wavelength limited organic photoelectric conversion film 43. In the second and fourth image plane phase difference detection pixels 52 from the left end in the diagram, the PD 46 generates an electric charge in response to light of Mg that has passed through the color filter 44 of W and the specified wavelength limited organic photoelectric conversion film 43.

In both the normal pixels 51 and the image plane phase difference detection pixels 52 of the image pickup device 50, incident light concentrated by the on-chip lens 13 enters the specified wavelength limited organic photoelectric conversion film 43 through the color filter 53 and the upper electrode 15, and a G component of the incident light is converted into an electric charge. Furthermore, light that has passed through the specified wavelength limited organic photoelectric conversion film 43 enters the PD 46 through the lower electrode 54, and is then converted into an electric charge. However, in the image plane phase difference detection pixel 52, incidence of light into the PD 46 is limited by the light-shielding film 55.

The electric charge generated by the specified wavelength limited organic photoelectric conversion film 43 of the normal pixels 51 and the image plane phase difference detection pixels 52 is output to a downstream stage through the lower electrode 54, and is used as a G component of an image signal. In addition, the electric charge generated by the PD 46 of the normal pixel 51 is output to a downstream stage through an electrode (not illustrated), and is used as an R or B component of an image signal.

Meanwhile, the electric charge generated by the PD 46 of the image plane phase difference detection pixel 52 in response to light of a wavelength of Mg is output to a downstream stage through an electrode (not illustrated). One of them is used as a phase difference signal for image plane phase difference AF.

<Sixth Configuration Example of Image Pickup Device to Which the Present Disclosure is Applied>

Figure 6:
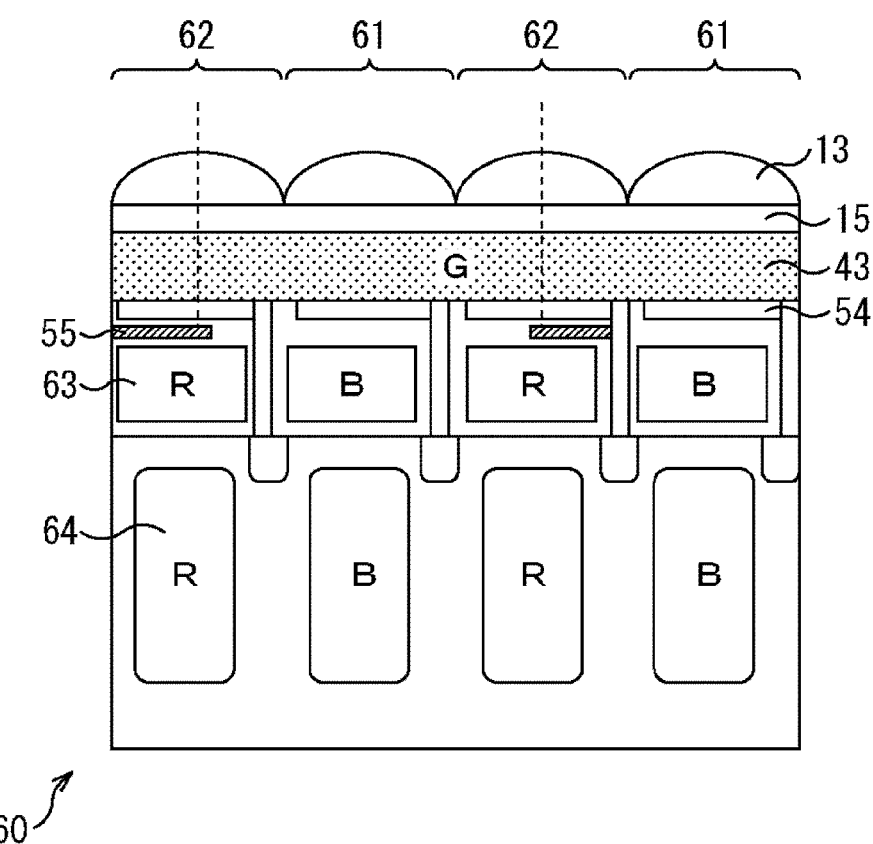
FIG. 6 is a cross-sectional view illustrating a sixth configuration example of the image pickup device to which the present disclosure is applied.

FIG. 6 is a cross-sectional view illustrating a sixth configuration example of the image pickup device to which the present disclosure is applied.

The image pickup device 60 includes normal pixels 61 and the image plane phase difference detection pixels 62. Two photoelectric conversion sections (the specified wavelength limited organic photoelectric conversion film 43 and a PD 64) are formed in each pixel. The image pickup device 60 has a configuration in which, as major constituent elements, the on-chip lens 13, the upper electrode 15, the specified wavelength limited organic photoelectric conversion film 43, the lower electrode 54, a color filter 63, and the PD 64 are formed in order from a light-incident side. Furthermore, in the image plane phase difference detection pixel 62, the light-shielding film 55 is formed between the lower electrode 54 and the color filter 63.

The color filter 63 has color of R or B. In this diagram, the color filter 63 has color of B in the normal pixel 61, and color of R in the image plane phase difference detection pixel 62. Note that color arrangement of the color filter 45 is not limited to the above-described example.

In the first and third image plane phase difference detection pixels 62 from the left end in the diagram, the PD 64 generates an electric charge in response to light of a wavelength of R that has passed through the specified wavelength limited organic photoelectric conversion film 43 and the color filter 63 of R. In the second and fourth normal pixels 61 from the left end in the diagram, the PD 64 generates an electric charge in response to light of a wavelength of B that has passed through the specified wavelength limited organic photoelectric conversion film 43 and the color filter 63 of B.

In both the normal pixel 61 and the image plane phase difference detection pixel 62 of the image pickup device 60, incident light concentrated by the on-chip lens 13 enters the specified wavelength limited organic photoelectric conversion film 43 through the upper electrode 15, and a G component of the light is converted into an electric charge. Furthermore, light that has passed through the specified wavelength limited organic photoelectric conversion film 43 enters the PD 64 through the lower electrode 54 and the color filter 63, and is then converted into an electric charge. However, in the image plane phase difference detection pixel 62, incidence of light into the PD 64 is limited by the light-shielding film 55.

The electric charge generated by the specified wavelength limited organic photoelectric conversion film 43 of the normal pixel 61 and the image plane phase difference detection pixel 62 is output to a downstream stage through the lower electrode 54, and is used as a G component of an image signal. In addition, the electric charge generated by the PD 64 of the normal pixel 61 is output to a downstream stage through an electrode (not illustrated), and is used as an R component of an image signal.

Meanwhile, the electric charge generated by the PD 64 of the image plane phase difference detection pixel 62 is output to a downstream stage through an electrode (not illustrated), and is used as a phase difference signal for image plane phase difference AF.

<Variation of Image Pickup Device to Which the Present Disclosure is Applied>

Figure 7:
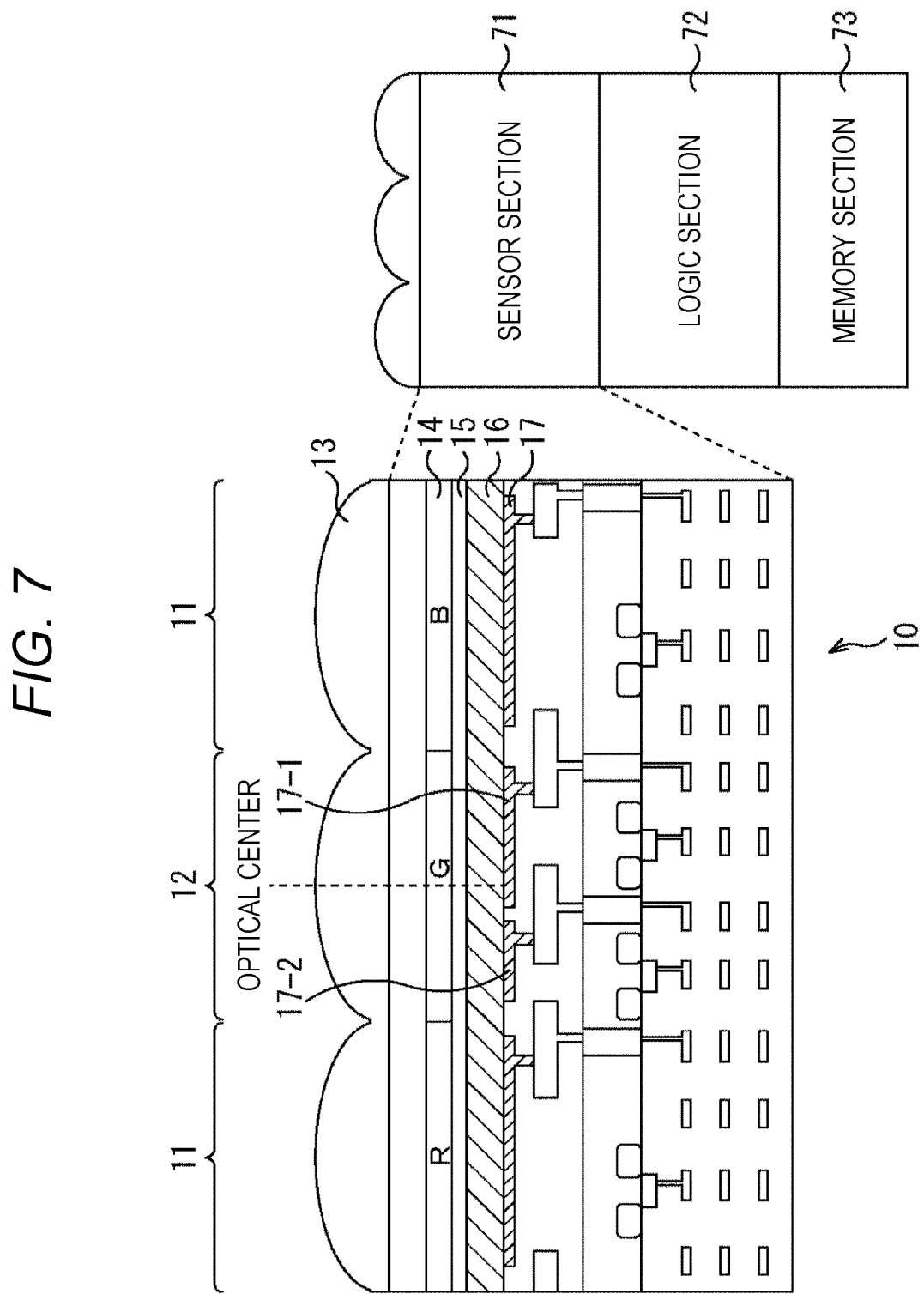
FIG. 7 is a cross-sectional view illustrating a seventh configuration example of the image pickup device to which the present disclosure is applied.

FIG. 7 is a variation of the image pickup device 10 illustrated in FIG. 1. That is, the variation illustrates a configuration example of an image sensor in which a sensor section 71 corresponding to the image pickup device 10 of FIG. 1, a logic section 72 including an analog digital converter (A/D converter) and the like, and a memory section 73 are stacked. The image sensor enables high-speed operation response by frame memory correlated double sampling (CDS). In addition, using the logic section 72 and the memory section 73 for image plane phase difference AF enables high-speed AF.

Note that as the stacked image sensor as illustrated in FIG. 7, not only the image pickup device 10 but also the above-described image pickup devices 20 to 60 can also be employed.

<Exemplary Use of Image Pickup Device>

Figure 8:
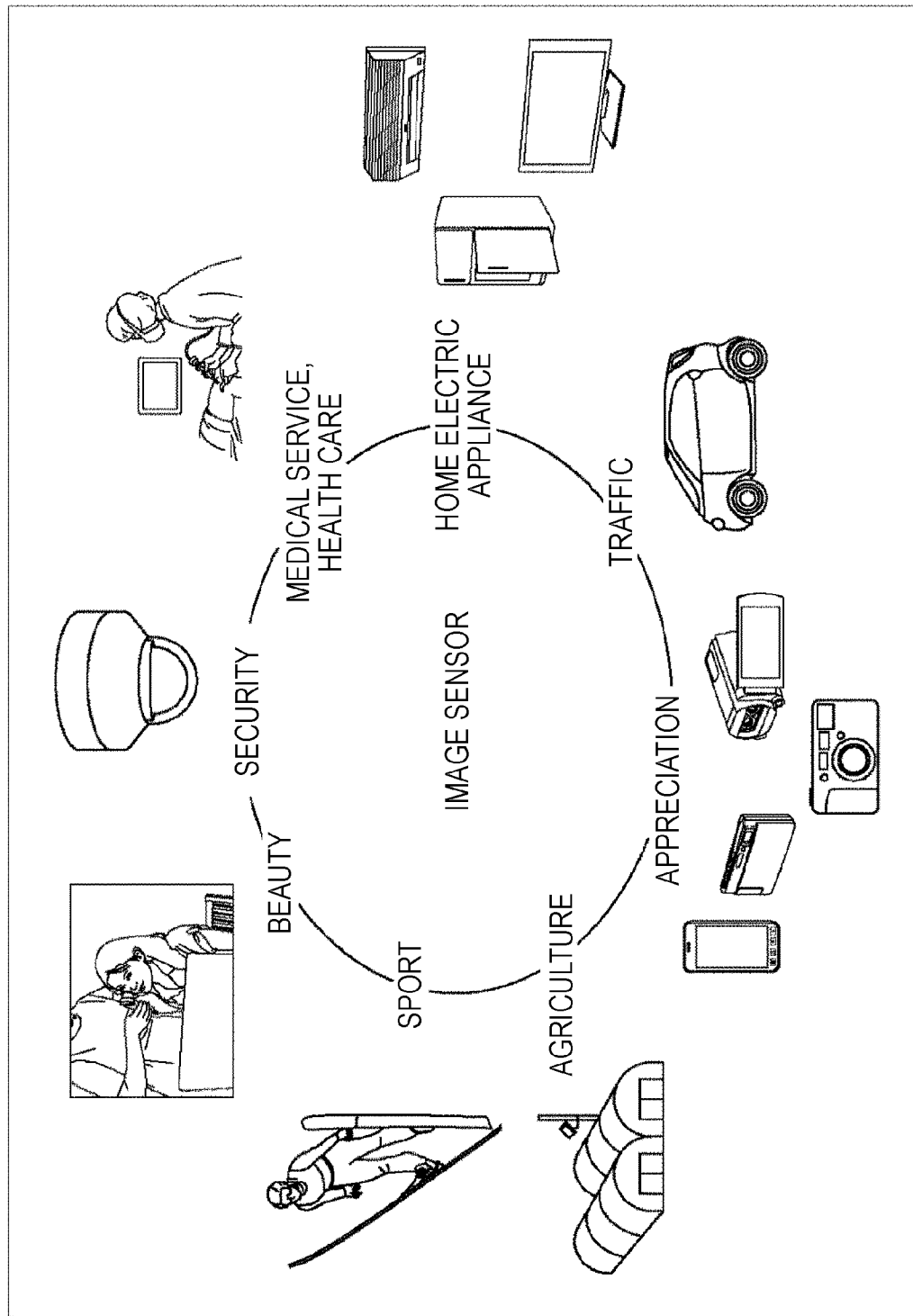
FIG. 8 is a diagram illustrating an exemplary use of electronic apparatuses to which the present disclosure is applied.

FIG. 8 is a diagram illustrating an exemplary use of electronic apparatuses that use the above-described image pickup devices 10 to 60.

The above-described image pickup devices 10 to 60 can be used, for example, in various cases of sensing light, such as visible light, infrared light, ultraviolet light, and X-ray, as follows.

Apparatus that captures images to be provided for use of appreciation, such as a digital camera and a portable device with a camera function.

Apparatus to be provided for use of traffic for driving safety including automatic stop, recognition of driver's condition, and the like, such as a vehicle-mounted sensor that captures images of front, back, surroundings, and inside of an automobile, a surveillance camera that monitors traveling vehicles and roads, and a distance measuring sensor that measures a distance between vehicles.

Apparatus to be provided for home electric appliances, such as a TV, a refrigerator, and an air conditioner, for capturing user's gesture and operating the appliance in response to the gesture.

Apparatus to be provided for use of medical services and health care, such as an endoscope and an apparatus that captures images of a blood vessel by receiving infrared light.

Apparatus to be provided for use of security, such as a surveillance camera for crime prevention applications and a camera for person authentication applications.

Apparatus to be provided for use of beauty, such as a skin measuring device that captures skin images and a microscope that captures scalp images.

Apparatus to be provided for use of sport, such as an action camera and a wearable camera for sporting applications and the like.

Apparatus to be provided for use of agriculture, such as a camera for monitoring a state of fields and farm products.

Note that the embodiment of the present disclosure is not limited to the above-described embodiment, and various changes can be made without departing from the spirit of the present disclosure.

The present disclosure may also have the following configurations.

(1)

An image pickup device including an image plane phase difference detection pixel for obtaining a phase difference signal for image plane phase difference AF, the image plane phase difference detection pixel including:

a first photoelectric conversion section that generates an electric charge in response to incident light;

an upper electrode section that is one of electrodes disposed facing each other across the first photoelectric conversion section, the upper electrode section being formed on an incident side of the incident light on the first photoelectric conversion section; and a lower electrode section that is another of the electrodes disposed facing each other across the first photoelectric conversion section, the lower electrode section being formed on an opposite side of the incident side of the incident light on the first photoelectric conversion section, the lower electrode section being multiple-divided at a position that avoids a center of the incident light.

(2)

The image pickup device according to (1) described above, wherein the lower electrode section includes a first lower electrode section and a second lower electrode section that are unevenly two-divided at the position that avoids the center of the incident light.

(3)

The image pickup device according to (1) or (2) described above, wherein the upper electrode section includes a member that transmits light, and the lower electrode section includes a member that reflects light.

(4)

The image pickup device according to (2) described above, wherein an output of one of the first and the second lower electrode sections is used as the phase difference signal for image plane phase difference AF.

(5)

The image pickup device according to (2) described above, wherein outputs of the first and the second lower electrode sections are added to be used as an image signal.

(6)

The image pickup device any one of (1) to (5) described above, further including a normal pixel for obtaining an image signal.

(7)

The image pickup device according to any one of (1) to (6) described above, wherein the image plane phase difference detection pixel further includes a light concentrating section that concentrates the incident light on the first photoelectric conversion section, and the lower electrode section is unevenly two-divided at a position that avoids an optical center of the light concentrating section.

(8)

The image pickup device according to any one of (1) to (7) described above, wherein the image plane phase difference detection pixel further includes a color filter that is colored on a pixel-by-pixel basis, the color filter causing only a specified wavelength component of the incident light to pass through the color filter and to enter the first photoelectric conversion section.

(9)

The image pickup device according to any one of (1) to (8) described above, wherein the first photoelectric conversion section generates an electric charge in response to only a specified wavelength component of the incident light.

(10)
The image pickup device according to any one of (1), (2), and (4) to (9) described above, wherein
the lower electrode section includes a member that transmits the incident light, and
the image plane phase difference detection pixel further includes a second photoelectric conversion section that generates an electric charge in response to light that passes through the first photoelectric conversion section and the lower electrode section.

(11)
The image pickup device according to (10) described above, wherein at least one of the first and the second photoelectric conversion sections is an organic photoelectric conversion film.

(12)
An electronic apparatus equipped with an image pickup device including an image plane phase difference detection pixel for obtaining a phase difference signal for image plane phase difference AF, the image plane phase difference detection pixel including:
a first photoelectric conversion section that generates an electric charge in response to incident light;
an upper electrode section that is one of electrodes disposed facing each other across the first photoelectric conversion section, the upper electrode section being formed on an incident side of the incident light on the first photoelectric conversion section; and
a lower electrode section that is another of the electrodes disposed facing each other across the first photoelectric conversion section, the lower electrode section being formed on an opposite side of the incident side of the incident light on the first photoelectric conversion section, the lower electrode section being multiple-divided at a position that avoids a center of the incident light.

(13)
An image pickup device including an image plane phase difference detection pixel for obtaining a phase difference signal for image plane phase difference AF, the image plane phase difference detection pixel including:
a first photoelectric conversion section that generates an electric charge to be used as an image signal in response to incident light;
an upper electrode section that is one of electrodes disposed facing each other across the first photoelectric conversion section, the upper electrode section being formed on an incident side of the incident light on the first photoelectric conversion section;
a lower electrode section that is another of the electrodes disposed facing each other across the first photoelectric conversion section, the lower electrode section being formed on an opposite side of the incident side of the incident light on the first photoelectric conversion section;
a second photoelectric conversion section that generates an electric charge to be used as the phase detection signal in response to light that passes through the first photoelectric conversion section and the lower electrode section; and
a light-shielding section formed between the lower electrode section and the second photoelectric conversion section to cover a center of the light that passes through the first photoelectric conversion section and the lower electrode section.

(14)
The image pickup device according to (13) described above, wherein the light-shielding section includes a member that reflects light.

(15)
An electronic apparatus equipped with an image pickup device including an image plane phase difference detection pixel for obtaining a phase difference signal for image plane phase difference AF, the image plane phase difference detection pixel including:
a first photoelectric conversion section that generates an electric charge to be used as an image signal in response to incident light;
an upper electrode section that is one of electrodes disposed facing each other across the first photoelectric conversion section, the upper electrode section being formed on an incident side of the incident light on the first photoelectric conversion section;
a lower electrode section that is another of the electrodes disposed facing each other across the first photoelectric conversion section, the lower electrode section being formed on an opposite side of the incident side of the incident light on the first photoelectric conversion section;
a second photoelectric conversion section that generates an electric charge to be used as the phase detection signal in response to light that passes through the first photoelectric conversion section and the lower electrode section; and
a light-shielding section formed between the lower electrode section and the second photoelectric conversion section to cover a center of the light that passes through the first photoelectric conversion section and the lower electrode section.

REFERENCE SIGNS LIST

10 Image pickup device
11 Normal pixel
12 Image plane phase difference detection pixel
13 On-chip lens
14 Color filter
15 Upper electrode
16 Organic photoelectric conversion film
17 Lower electrode
20 Image pickup device
30 Image pickup device
31 Normal pixel
32 Image plane phase difference detection pixel
33 Specified wavelength limited organic photoelectric conversion film
40 Image pickup device
41 Normal pixel
42 Image plane phase difference detection pixel
43 Specified wavelength limited organic photoelectric conversion film
44 Lower electrode
45 Color filter
46 PD
50 Image pickup device
51 Normal pixel
52 Image plane phase difference detection pixel
53 Color filter
54 Lower electrode
55 Light-shielding film
60 Image pickup device
61 Normal pixel
62 Image plane phase difference detection pixel
63 Color filter 64 PD
71 Sensor section
72 Logic section
73 Memory section

The invention claimed is:

1. A light detecting device, comprising:
 a photoelectric conversion unit, comprising:
  an upper electrode;
  a lower electrode, comprising a first lower electrode section and a second lower electrode section; and
  a photoelectric conversion film disposed between the upper electrode and the lower electrode; and
 an on-chip lens disposed above the photoelectric conversion unit, wherein, in a plan view, the on-chip lens overlaps the first lower electrode section and the second lower electrode section, and wherein an optical center of the on-chip lens overlaps one of the first lower electrode section and the second lower electrode section and does not overlap the other of the first lower electrode section and the second lower electrode section.

2. The light detecting device according to claim 1, wherein, in the plan view, a size of the first lower electrode section is different from a size of the second lower electrode section.

3. The light detecting device according to claim 1, wherein the upper electrode transmits light and the lower electrode reflects the light.

4. The light detecting device according to claim 1, wherein outputs of the first lower electrode section and the second lower electrode section may be added to be used as an image signal.

5. The light detecting device according to claim 1, wherein an output of one of the first lower electrode section or the second lower electrode section may be used as a phase difference signal.

6. The light detecting device according to claim 1, wherein the lower electrode is unevenly divided into the first lower electrode section and the second lower electrode section.

7. The light detecting device according to claim 1, further comprising:
 normal pixels for obtaining image signals; and
 image plane phase difference detection pixels for obtaining phase difference signals for image plane phase difference Auto Focus (AF).

8. The light detecting device according to claim 7, wherein the normal pixels have a red or blue color filter, and wherein the image plane phase difference detection pixels have a green color filter.

9. The light detecting device according to claim 1, wherein the upper electrode is formed of a transparent material that transmits incident light concentrated by the on-chip lens, and wherein at least one of: the first lower electrode section and the second lower electrode section is made of a metal material that reflects the incident light.

10. An imaging device, comprising:
 a light detecting device, comprising:
  a photoelectric conversion unit, comprising:
   an upper electrode;
   a lower electrode, comprising a first lower electrode section and a second lower electrode section; and
   a photoelectric conversion film disposed between the upper electrode and the lower electrode; and
  an on-chip lens disposed above the photoelectric conversion unit, wherein, in a plan view, the on-chip lens overlaps the first lower electrode section and the second lower electrode section, and wherein an optical center of the on-chip lens overlaps one of the first lower electrode section and the second lower electrode section and does not overlap the other of the first lower electrode section and the second lower electrode section.

11. The imaging device according to claim 10, wherein, in the plan view, a size of the first lower electrode section is different from a size of the second lower electrode section.

12. The imaging device according to claim 10, wherein the upper electrode transmits light and the lower electrode reflects the light.

13. The imaging device according to claim 10, wherein outputs of the first lower electrode section and the second lower electrode section may be added to be used as an image signal.

14. The imaging device according to claim 10, wherein an output of one of the first lower electrode section or the second lower electrode section may be used as a phase difference signal.

15. The imaging device according to claim 10, wherein the lower electrode is unevenly divided into the first lower electrode section and the second lower electrode section.

16. The imaging device according to claim 10, further comprising:
 normal pixels for obtaining image signals; and
 image plane phase difference detection pixels for obtaining phase difference signals for image plane phase difference Auto Focus (AF).

17. The imaging device according to claim 16, wherein the normal pixels have a red or blue color filter, and wherein the image plane phase difference detection pixels have a green color filter.

18. The imaging device according to claim 10, wherein the upper electrode is formed of a transparent material that transmits incident light concentrated by the on-chip lens, and wherein at least one of: the first lower electrode section and the second lower electrode section is made of a metal material that reflects the incident light.

* * * * *